(12) United States Patent
Hagiwara

(10) Patent No.: US 8,404,057 B2
(45) Date of Patent: Mar. 26, 2013

(54) SOLDERING FLUX

(75) Inventor: Takashi Hagiwara, Mooka (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 1228 days.

(21) Appl. No.: 11/661,322

(22) PCT Filed: Aug. 22, 2005

(86) PCT No.: PCT/JP2005/015187
§ 371 (c)(1),
(2), (4) Date: Oct. 1, 2007

(87) PCT Pub. No.: WO2006/025224
PCT Pub. Date: Mar. 9, 2006

(65) Prior Publication Data
US 2008/0135133 A1    Jun. 12, 2008

(30) Foreign Application Priority Data
Aug. 31, 2004   (JP) ................................. 2004-253186

(51) Int. Cl.
*B23K 35/34*   (2006.01)
(52) U.S. Cl. ......................................... 148/23; 228/224
(58) Field of Classification Search ................ 148/24, 148/23; 228/224
See application file for complete search history.

(56) References Cited

U.S. PATENT DOCUMENTS

2003/0159761 A1 *  8/2003  Ikeda et al. ................... 148/24

FOREIGN PATENT DOCUMENTS

| EP | 0 670379 | 9/1995 |
|----|----------|--------|
| EP | 1 342726 | 9/2003 |
| JP | 64 011094 | 1/1989 |
| JP | 08 197282 | 8/1996 |
| JP | 11 286798 | 10/1999 |
| JP | 2004 042050 | 2/2004 |
| WO | 98 08362 | 2/1998 |

* cited by examiner

*Primary Examiner* — Weiping Zhu
(74) *Attorney, Agent, or Firm* — Michael Tobias

(57) ABSTRACT

[Problems] Addition of an organic acid such as a dicarboxylic acid to a soldering flux in order to improve wettability causes a reaction with copper oxide to form a metallic soap of copper having a green color. Although this metallic soap of copper is not corrosive and does not decrease reliability, its external appearance is impossible to distinguish it from verdigris which is indicative of corrosion. There is need for a soldering flux which does not form a metallic soap of copper.
[Means for Solving the Problems] Addition of a tetrazole or a tetrazole derivative to a soldering flux can prevent carboxyl groups from reacting exclusively with copper ions, thereby suppressing the formation of a metallic soap of copper having a green color. Among tetrazoles and tetrazole derivatives, 5-phenyl-1H-tetrazole and its derivatives which have hydrogen as a substituent in the 1-position and a phenyl, group which strongly attracts electron in the 5-position are effective at improving soldering since they result in an increased polarity in the solvent.

11 Claims, No Drawings

SOLDERING FLUX

TECHNICAL FIELD

This invention relates to a soldering flux. In particular, it relates to a soldering flux which does not cause discoloration into green when used for soldering of copper lands.

BACKGROUND ART

Joining of metals using a metal braze is referred to as brazing. A brazing material having a low melting temperature and which comprises Sn and Pb is referred to as solder. Solder has been used as a joining material from long in the past. Since solder has a low melting temperature and a high joining reliability, it is widely used for assembly of printed circuit boards and electronic parts in electronic equipment. In printed circuit boards and electronic parts for electronic equipment, their surfaces are oxidized by exposure to air during storage as inventory after they are manufactured. As a result, joining cannot take place with solder merely by heating solder and a printed circuit board or an electronic part together. In order to join solder to a printed circuit board, an auxiliary material referred to as a flux is used. A flux has a function to remove oxides from the surfaces of the solder and the printed circuit board thereby making the surface of the printed circuit board easily wetted by solder.

Fluxes are classified as resin-type fluxes comprising a water insoluble resin such as rosin or a synthetic resin and an activator added thereto, water soluble fluxes comprising a water soluble resin such as polyethylene glycol and an organic acid-type activator which are dissolved in water or an organic solvent, and inorganic fluxes comprising an inorganic substance such as hydrochloric acid or zinc chloride. With an inorganic flux and a water soluble flux, it is always necessary after soldering to wash away flux residue, while a resin-type flux can often be used without washing. Therefore, soldering of printed circuit boards is primarily carried out using a resin-type flux.

Methods used for assembly of printed circuit boards and electronic parts in electronic equipment include manual soldering in which a solder wire impregnated with flux is melted with a soldering iron to carry out soldering, flow soldering in which rod-shaped solder is melted in a solder bath and a printed circuit board which is coated with a post flux is immersed in the solder bath, and reflow soldering in which a printed circuit board which is printed with a solder paste comprising solder powder and a flux is heated in a reflow furnace. Among these methods, flow soldering is widely used because of its suitability for mass production and its low cost.

A post flux used in flow soldering comprises a resin such as rosin or a modified rosin and an activator such as an amine hydrohalide or an organic acid dissolved in an alcoholic solvent such as ethanol or isopropanol. Rosin is a mixture of terpenic organic acids such as abietic acid and d-pimaric acid and exerts an activating action on flux. In addition, the residue of rosin remaining after soldering is essentially non-corrosive, non-hygroscopic, and electrically insulating at room temperature, thereby making it possible to use the flux without washing.

However, in soldering under conditions of high temperature and high humidity such that moisture condensation takes place, if flux residue is not washed away, the copper foil on a printed circuit board may react with active substances such as halogens in the flux residue and with water, resulting in the formation of a green-colored corrosion product having the formula $CuCO_3$—$Cu(OH)_2$ and referred to as verdigris. Verdigris is poisonous, and it is nearly insoluble in water and alcohols. Verdigris was frequently formed when inorganic fluxes based on hydrochloric acid or zinc chloride were used before highly reliable resin-type fluxes came to be used. At present, highly active fluxes which cause verdigris to form are no longer used for assembly of printed circuit boards or electronic parts, but even with resin-type fluxes, verdigris is infrequently formed under conditions of high temperature and high humidity which produce moisture condensation.

In addition to verdigris which is produced by corrosion, depending upon the flux, green-colored compounds are sometimes formed. In a resin-type post flux, an amine hydrohalide is used as an activator. If a large amount of an amine hydrohalide is employed in such a flux in order to improve the wettability of the flux, corrosive properties and insulating properties end up decreasing. Therefore, a large amount of an amine hydrohalide cannot be used. Instead, wettability is enhanced by adding an organic acid such as a dicarboxylic acid. However, if a large amount of an organic acid such as a dicarboxylic acid is used in a resin-type post flux, carboxyl groups of the dicarboxylic acid react with copper oxide and form a metallic soap of copper having a green color. This metallic soap cannot be distinguished by external appearance from verdigris, so it often becomes a problem during soldering of printed circuit boards.

It is possible to distinguish a metallic soap of copper from verdigris based on the fact that a metallic soap of copper dissolves in a solvent such as an alcohol, whereas verdigris does not. A metallic soap of copper which is formed due to using an organic acid is not corrosive and it does not cause a decrease in reliability, but it is easily mistaken for verdigris, which is indicative of corrosion. A post flux which prevents this problem by adding a gallate ester in order to inhibit a metallic soap of copper from forming has been proposed (JP 64-11094 A1).

Patent Document 1: JP 64-11094 A1

DISCLOSURE OF THE INVENTION

Problem which the Invention is to Solve

As stated above, when an organic acid such as a dicarboxylic acid is added to a soldering flux in order to improve wettability, it reacts with copper oxide and forms a green colored metallic soap of copper, which from external appearance, cannot be distinguished in any way from verdigris which is indicative of corrosion. Accordingly, there is a need for a soldering flux which does not form a metallic soap of copper.

A method of preventing the formation of a metallic soap of copper by adding a gallate to a soldering flux is known. However, this method has the drawback that it cannot be used in electronic equipment requiring reliability since the reactivity of a gallate is so high that it reacts with copper in a high humidity environment, thereby causing corrosion. If benzotriazole is added to a soldering flux, the formation of a metallic soap of copper is prevented and it becomes difficult for discoloration to occur, but the addition of benzotriazole decreases the wettability of the flux. Therefore, when adding benzotriazole to a flux, it is necessary to add a strong activator, and hence reliability may decrease. The problem which the present invention is to solve is to provide a soldering flux having high reliability in that it does not cause corrosion or form a metallic soap of copper having a green color even in a high temperature, high humidity environment in electronic equipment requiring reliability such as electronic equipment to be mounted on a vehicle.

Means for Solving the Problem

The present inventors found that the formation of a metallic soap of copper can be suppressed by adding a tetrazole or its derivative to a soldering flux, and they completed the present invention.

An organic acid such as a dicarboxylic acid contained in a soldering flux releases carboxyl groups when dissociated in a solvent such as an alcohol and thus confers acidity. A metallic soap of copper having a green color is formed by a reaction of the released carboxyl groups and copper ions. Rosin contains carboxyl groups, so even with a soldering flux which does not contain an organic acid such as a dicarboxylic acid, a resin-type flux using rosin causes the formation of a metallic soap of copper having a green color. Addition of a tetrazole or a tetrazole derivative to a soldering flux can prevent the reaction between carboxyl groups and copper ions from occurring preferentially and thus suppress the formation of a metallic soap of copper having a green color.

A tetrazole is a compound having a 5-membered ring consisting of four nitrogen atoms and one carbon atom and having two double bonds. The double bonds of a tetrazole ring contained in a tetrazole donate electrons to each other, so its polarity tends to easily deviate. Therefore, tetrazoles and tetrazole derivatives easily dissociate electrons in a solvent such as an alcohol, and they provide the same solderability as organic acids. In contrast to benzotriazole which has the same effect of suppressing the formation of metallic soap, tetrazoles and tetrazole derivatives do not impede solderability, so their addition does not worsen solderability. Therefore, they can be used in a soldering flux as an auxiliary activator in place of a dicarboxylic acid. Tetrazoles and tetrazole derivatives used in the present invention can be used by themselves, or they can be used together with an organic acid such as a dicarboxylic acid or a dimer acid. Even in the latter case, it is possible to suppress the formation of a metallic soap of copper having a green color.

Since the tetrazole ring which tetrazoles and tetrazole derivatives have is stable, a tetrazole or a tetrazole derivative contained in a soldering flux does not readily react with metals such as copper, but in an acidic solution or the like, it reacts with a metal such as copper and form a metal salt. Even this case, a copper salt of a tetrazole which is formed by a reaction between copper and a tetrazole or a tetrazole derivative is colorless and transparent, and it is never confused with verdigris. The copper salt of a tetrazole is stable in a solvent, but if it crystallizes, it may explode when heated, so it is necessary to ensure that a large amount of a metal salt of copper with a tetrazole or a tetrazole derivative is not formed.

If the amount of a tetrazole or a tetrazole derivative added to a soldering flux is according to the present invention is smaller than 0.05 mass %, the effect of preventing carboxyl groups and copper ions from preferentially reacting thereby suppressing the formation of a metallic soap of copper having a green color is not obtained. If it is more than 5 mass %, the reaction between copper and a tetrazole becomes violent, and it becomes easy for an explosive metal salt of copper and tetrazole or a tetrazole derivative to form. Therefore, the amount of a tetrazole or a tetrazole derivative used in a soldering flux according to the present invention must be in the range of 0.05-5 mass %. More preferably, it is in the range of 0.2-5 mass %.

The present invention is a resin-type soldering flux comprising a resin, an activator, and a solvent, wherein 0.05-5 mass % of a tetrazole or a derivative thereof is added thereto.

Examples of tetrazoles and tetrazole derivatives which are used in the present invention include 1H-tetrazole, 2H-tetrazole, 5-amino-1H-tetrazole, 5-phenyl-1H-tetrazole, 5-methyl-1H-tetrazole, 1-methyl-5-ethyl-1H-tetrazole, 1-methyl-5-mercapto-1H-tetrazole, 1-phenyl-5-mercapto-1,2,3,4-tetrazole, 1-(2-dimethylaminoethyl)-5-mercapto-1H-tetrazole, 5,5'-bi-1H-tetrazole, and 5,5'-azobis-1H-tetrazole.

Among tetrazoles and tetrazole derivatives used in the present invention, those in which the substituent attached to the 1-position of the tetrazole ring is hydrogen have a strong electron-attracting function, and they easily dissociate in a solvent, so their solderability is particularly good. The tetrazole in which the substituent attached to the 1-position of the tetrazole ring is hydrogen is 1H-tetrazole, and derivatives thereof include 5-phenyl-1H-tetrazole, 5-amino-1H-tetrazole, and the like. Of these, 5-phenyl-1H-tetrazole and its derivatives in which the substituent attached to the 1-position is hydrogen and which have a phenyl group having a strong electron-attractive property in the 5-position have increased polarity in a solvent, and they provide particularly good solderability.

The present invention is a resin-type soldering flux comprising a resin, an activator, and a solvent wherein 0.05-5 mass % of a 5-phenyl tetrazole or a derivative thereof is added thereto.

A soldering flux according to the present invention can be used not only as a post flux for flow soldering, but also as a flux for a flux-cored solder and a flux for a solder paste. Due to addition of a tetrazole or a tetrazole derivative, a soldering flux according to the present invention not only suppresses the formation of a metallic soap of copper having a green color, but it also has the effect of preventing corrosion by organic acids and activators since it suppresses a reaction between carboxyl groups and copper ions. Therefore, when a soldering flux according to the present invention is used in a solder paste which is used in soldering of fine parts and which easily undergoes alterations in properties due to corrosion, good soldering without the occurrence of corrosion can be achieved.

The present invention is a solder paste having a solder powder mixed with a flux, wherein the flux has 0.05-5 mass % of a tetrazole or a derivative thereof added thereto.

Effects of the Invention

A soldering flux according to the present invention suppresses a reaction between carboxyl groups contained in a dicarboxylic acid and the like and copper ions, so it has the effect of preventing the formation of a metallic soap of copper having a green color resulting from the reaction of carboxyl groups and copper oxides. Therefore, use of a soldering flux according to the present invention makes it difficult to form a metallic soap of copper with carboxyl groups which is difficult to distinguish from verdigris formed by corrosion of copper. As a result, when a problem with electronic equipment develops, it can be easily determined if the cause is a so-called soldering defect due to the occurrence of corrosion of copper or a problem caused by the electronic part itself, so a countermeasure can be quickly taken.

BEST MODE FOR CARRYING OUT THE INVENTION

The formation of a metallic soap of copper found when using a soldering flux occurs due to the presence of a substance containing carboxyl groups. Therefore, a soldering flux according to the present invention is effective when using a rosin-type resin such as rosin or a modified rosin or a carboxyl-containing resin such as an acrylic resin, and its effect is particularly significant when using a rosin-type resin such as rosin or a modified rosin. Rosin-type resins contain carboxylic acids such as abietic acid, neoabietic acid, dihyrdoabietic acid, and d-pimaric acid. Thus, the present invention is a resin-type soldering flux comprising a resin, an activator, and a solvent, wherein the resin used in the resin-type flux is a rosin-type resin, and 0.05-5 mass % of a tetrazole or its derivatives is added to the soldering flux.

A soldering flux according to the present invention is also effective when it includes a carboxyl-containing substance such as a dicarboxylic acid or dimer acid. As is the case with a resin such as rosin, the flux suppresses a reaction between carboxyl groups contained in the dicarboxylic acid or the like and copper ions and has the effect of preventing the formation of a metallic soap of copper having a green color.

Examples of dicarboxylic acids which can be used in a soldering flux according to the present invention include adipic acid, glutaric acid, and sebacic acid, and examples of useful dimer acids include those formed by dimerization of oleic acid and the like.

Post fluxes (Example 1) and fluxes for solder paste (Example 2) having the below-described compositions were prepared, and their corrosive properties and wettability were compared.

Example 1

Post fluxes having the compositions shown in Table 1 were prepared, and their corrosive properties on a copper plate and wettability were compared with those of comparative examples. The wettability of a flux was evaluated using a solder spreading test. The results are shown in Table 1.

TABLE 1

| | | Examples | | | | | | | | | | Comp. Examples | | | |
|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 |
| Flux component | Polymerized rosin | 10 | 10 | 10 | 10 | 10 | 10 | 10 | 10 | 10 | 10 | 10 | 10 | 10 | 10 |
| | Diphenyl-guanidine-HBr | 0.5 | 0.5 | 0.5 | 0.5 | 0.5 | 0.5 | 0.5 | 0.5 | 0.5 | 0.5 | 0.5 | 0.5 | 0.5 | 0.5 |
| | Adipic acid | 2 | 2 | 2 | | | | | | | | 2 | | 2 | 2 |
| | Dimer acid | | | | 2 | 2 | 2 | 2 | 2 | 2 | 2 | | 2 | | |
| | 2,3-dibromo-2-butene-1,4-diol | 0.5 | 0.5 | 0.5 | 0.5 | 0.5 | 0.5 | 0.5 | 0.5 | 0.5 | 0.5 | 0.5 | 0.5 | 0.5 | 0.5 |
| | 5-phenyl-tetrazole | 0.05 | 0.2 | 5 | 0.05 | 0.2 | 5 | | | | | | | | |
| | Phenyltetrazole-5-thiol | | | | | | | 0.2 | | | | | | | |
| | Hydroxyphenyl-tetrazole-5-thiol | | | | | | | | 0.2 | | | | | | |
| | 1H-tetrazole | | | | | | | | | 0.2 | | | | | |
| | 5-chloro-1-phenyl tetrazole | | | | | | | | | | 0.2 | | | | |
| | Benzotriazole | | | | | | | | | | | | | | 0.1 |
| | Propyl gallate | | | | | | | | | | | | | 0.5 | |
| | IPA | rem | rem | rem | rem | rem | rem | rem | rem | rem | rem | rem | rem | rem | rem |
| Test | Copper plate corrosion test | Δ | ○ | ○ | Δ | ○ | ○ | ○ | ○ | ○ | ○ | X | X | X | ○ |
| | Spreading ratio (%) | 76 | 75 | 68 | 76 | 75 | 69 | 75 | 75 | 75 | 75 | 76 | 76 | 76 | 58 |

1. Method of copper plate corrosion test (according to JIS Z 3197 8.4.1)
1) A phosphorus deoxidized copper plate measuring 50 mm × 50 mm × 0.5 mm has a 3 mm indentation formed at its center by means of a steel sphere with a diameter of 20 mm to prepare a test piece. The test piece is degreased in acetone and then immersed for 1 minute in sulfuric acid at 65° C. to remove an oxide film on its surface. The test piece is then immersed for 1 minute in ammonium persulfate solution at 20° C., and it is washed with purified water and dried to obtain a copper plate for testing.
2) A solder wire is degreased using acetone, and an amount thereof weighing 1.00 + 0.05 grams is placed in the indentation at the center of the test plate.
3) The solids contents of a flux to be tested is determined by the method set forth in JIS Z 3197 8.1.3, and an amount of the post flux corresponding to 0.035-0.040 grams as solids content is measured out from a burette and added to the indentation at the center of the test plate.
4) The copper test plate is placed atop a solder bath set to 235 + 2° C. and heated. After the solder has melted, the test plate is maintained atop the solder bath for 5 seconds, and then it is lifted from the solder bath and cooled for 15 minutes in a horizontal position.
5) The copper test plate is placed into a thermohygrostat set to a temperature of 40 + 2° C. and a relative humidity of 90-95%. For each flux, two copper test plates and one blank are tested.
6) After 96 hours, the copper test plate is removed from the thermohygrostat, and it is observed under a microscope at a magnification of 30× for corrosion marks which are compared with those of the blank.
7) Corrosion of the copper plate was evaluated as follows.
○: no discoloration;
Δ: some discoloration;
X: the color of the residue is green or blue, and there is much discoloration.

2. Method of solder spreading test (according to JIS Z 3197 8.3.1.1)
1) The surface of a phosphorus deoxidized copper plate measuring 50 mm × 50 mm × 0.5 mm is polished by abrasive paper while 2-propanol is dripped onto the surface, and it is then washed with 2-propanol and fully dried. It is then placed into a dryer set to a temperature of 150 + 3° C. and subjected to oxidizing treatment therein for 1 hour to obtain a copper oxide test plate.
2) A solder wire with a diameter of 1.6 mm and having a solder composition of Sn—3.0Ag—0.5Cu is wound onto a rod with a diameter of 3.2 mm, and one winding thereof is used as a solder test material.
3) 0.05 + 0.005 ml of a post flux to be tested is measured out onto the copper oxide test plate, and the solder test material is placed atop it. The copper test plate is then placed atop a solder bath set to 270 + 2° C. and heated. After the solder has melted, the plate is maintained atop the solder bath for 5 seconds and then lifted from the solder bath and cooled for 15 minutes in a horizontal position.
4) The height of the molten solder which have melted and spread is measured, and the spreading ratio of the solder is calculated by Equation 1. Here, $S_R$ is the spreading ratio (%), H is the height (mm) of the spread solder, and D is the diameter (mm) of the solder used in the test when viewed as a sphere, wherein $D = 1.24 V^{1/3}$, where V is the mass of the solder used in the test divided by its density (see note).
(Note)
The mass of solder used in the test was the mass of the sample minus the mass of the flux contained therein.

$$S_R = (D-H)/D \times 100 \quad \text{[Equation 1]}$$

Example 2

Solder pastes having the compositions shown in Table 2 were prepared and compared with comparative examples by testing them by a copper mirror corrosion test. The results are shown in Table 2.

TABLE 2

| | | Examples | | | | | | | Comparative | |
|---|---|---|---|---|---|---|---|---|---|---|
| | | 1 | 2 | 3 | 4 | 5 | 6 | 7 | 1 | 2 |
| Flux component | Polymerized rosin | 35 | 35 | 35 | 35 | 35 | 35 | 35 | 35 | 35 |
| | Hydrogenated rosin | 14.95 | 14.8 | 10 | 14.8 | 14.8 | 14.8 | 14.8 | 15 | 14.8 |
| | Hardened castor oil | 5 | 5 | 5 | 5 | 5 | 5 | 5 | 5 | 5 |
| | 2-ethylhexyl diglycol | rem | rem | rem | rem | rem | rem | rem | rem | rem |
| | Sebacic acid | 2 | 2 | 2 | 2 | 2 | 2 | 2 | 2 | 2 |
| | 2,3-dibromo-2-buten-1,4-diol | 3 | 3 | 3 | 3 | 3 | 3 | 3 | 3 | 3 |
| | 5-phenyltetrazole | 0.05 | 0.2 | 5 | | | | | | |
| | Phenyltetrazole-5-thiol | | | | 0.2 | | | | | |
| | Hydroxyphenyl-tetrazole-5-thiol | | | | | 0.2 | | | | |
| | 1H-tetrazole | | | | | | 0.2 | | | |
| | 5-chloro-1-phenyl-tetrazole | | | | | | | 0.2 | | |
| | Propyl gallate | | | | | | | | | 0.2 |
| Test | Copper mirror test | ○ | ○ | ○ | ○ | ○ | ○ | ○ | X | X |

1. Method of copper mirror corrosion test (according to JIS Z 3197 8.4.2)
1) A flux for a solder paste is dissolved in 2-propanol to prepare a 25 mass % 2-propanol solution, which is used as a sample for measurement. Similarly, a WW rosin is dissolved in 2-propanol to prepare a 25 mass % 2-propanol solution of WW rosin as a comparative sample.
2) The surface of a glass slide measuring 1.0 × 52 × 76 mm is washed with acetone and dried, and then copper is deposited thereon by vacuum deposition to prepare a test piece.
3) A copper mirror test piece is placed horizontally with its mirror surface facing upwards, and approximately 0.05 ml of the flux solution as a sample is dripped on it to prepare a test specimen. Another test piece having 25 mass % of 2-propanol solution of WW rosin dripped thereon is used as a comparative specimen.
4) Within 5 minutes after dripping of the flux, the copper test plate is placed into a thermohygrostat set to a temperature of 40 + 2° C. and a relative humidity of 90-95% and left for 24 hours. After 24 hours, it is removed from the thermohygrostat, and the mirror surface is washed with 2-propanol and dried. The degree of corrosion of the copper mirror test piece is compared with the comparative test piece and evaluated.
5) The standard for evaluating copper mirror corrosion was as follows.
○: no disappearances observed in the copper mirror
X: a disappearance observed in the copper mirror A soldering flux according to the present invention does not cause corrosion compared to a comparative example having a gallate ester added thereto, its wettability is good compared to that of a flux having benzotriazole added thereto, and it is superior in that it does not form a metallic soap of copper which is easily mistaken for verdigris.

The invention claimed is:

1. A soldering flux comprising a resin, an activator, and a solvent, the flux containing 0.05-5 mass % of a tetrazole or a derivative thereof represented by the following formula:

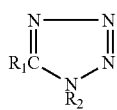

wherein $R_1$ and $R_2$ are each an alkyl group, an aryl group, a benzyl group, or hydrogen.

2. A soldering flux as claimed in claim 1 wherein the derivative of a tetrazole is 5-phenyltetrazole or a derivative thereof.

3. A soldering flux as claimed in claim 1 wherein the resin comprises a rosin.

4. A soldering flux as claimed in claim 1 further comprising a dicarboxylic acid or a dimer acid.

5. A soldering flux as claimed in claim 1 comprising a compound containing a carboxyl group.

6. A soldering flux as claimed in claim 1 wherein the flux contains 0.2-5 mass % of the tetrazole or derivative thereof.

7. A soldering method comprising soldering a printed circuit board having copper lands using a soldering flux as claimed in claim 1.

8. A soldering method as claimed in claim 7 wherein the flux contains 0.2-5 mass % of the tetrazole or derivative thereof.

9. A solder paste comprising a solder powder mixed with a flux containing 0.05-5 mass % of a tetrazole or a derivative thereof represented by the following formula:

wherein $R_1$ and $R_2$ are each an alkyl group, an aryl group, a benzyl group, or hydrogen.

10. A solder paste as claimed in claim 9 wherein the flux comprises a compound containing a carboxyl group.

11. A solder paste as claimed in claim 9 wherein the flux contains 0.2-5 mass % of the tetrazole or derivative thereof.

* * * * *